US012132122B2

(12) United States Patent
Zeng et al.

(10) Patent No.: US 12,132,122 B2
(45) Date of Patent: Oct. 29, 2024

(54) SINGLE CHIP POWER DIODE AND METHOD OF PRODUCING A SINGLE CHIP POWER DIODE

(71) Applicant: Infineon Technologies Austria AG, Villach (AT)

(72) Inventors: Guang Zeng, Haar (DE); Moritz Hauf, Munich (DE); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/136,698

(22) Filed: Apr. 19, 2023

(65) Prior Publication Data

US 2023/0290885 A1 Sep. 14, 2023

Related U.S. Application Data

(63) Continuation of application No. 17/380,163, filed on Jul. 20, 2021, now Pat. No. 11,664,464.

(30) Foreign Application Priority Data

Jul. 22, 2020 (DE) .......................... 102020119349.1

(51) Int. Cl.
*H01L 29/861* (2006.01)
*H01L 29/06* (2006.01)
*H01L 29/66* (2006.01)

(52) U.S. Cl.
CPC ........ *H01L 29/861* (2013.01); *H01L 29/0607* (2013.01); *H01L 29/6609* (2013.01)

(58) Field of Classification Search
CPC .............. H01L 29/861; H01L 29/0607; H01L 29/6609; H01L 23/36; H01L 23/49562;
(Continued)

(56) References Cited

U.S. PATENT DOCUMENTS

2016/0307997 A1  10/2016  Arthur et al.
2018/0138170 A1*  5/2018  Hosokawa ........ H01L 21/26513
2019/0043998 A1   2/2019  Nishii

FOREIGN PATENT DOCUMENTS

EP       1033761 A2     9/2000
JP       H10326900 A    12/1998

* cited by examiner

*Primary Examiner* — Mohammad A Rahman
(74) *Attorney, Agent, or Firm* — Murphy, Bilak & Homiller, PLLC

(57) ABSTRACT

A single chip power diode includes a semiconductor body having an anode region coupled to a first load terminal and a cathode region coupled to a second load terminal. An edge termination region surrounding an active region is terminated by a chip edge. The semiconductor body thickness is defined by a distance between at least one first interface area formed between the first load terminal and the anode region and a second interface area formed between the second load terminal and the cathode region. At least one inactive subregion is included in the active region. Each inactive subregion: has a blocking area with a minimal lateral extension of at least 20% of a drift region thickness; configured to prevent crossing of the load current between the first load terminal and the semiconductor body through the blocking area; and at least partially not arranged adjacent to the edge termination region.

30 Claims, 13 Drawing Sheets

(58) Field of Classification Search
CPC ............. H01L 29/0638; H01L 29/0692; H01L 2224/4846; H01L 2224/4847; H01L 29/0649; H01L 29/8611; H01L 29/8613; H01L 29/0611; H01L 29/0684; H01L 29/66136; H01L 29/8616; H01L 29/0634
See application file for complete search history.

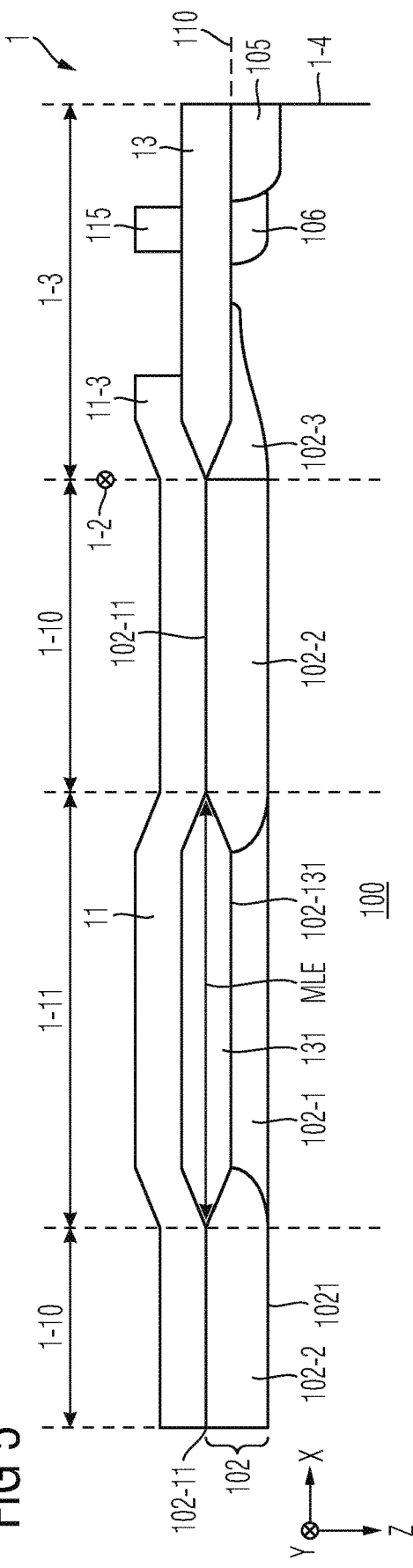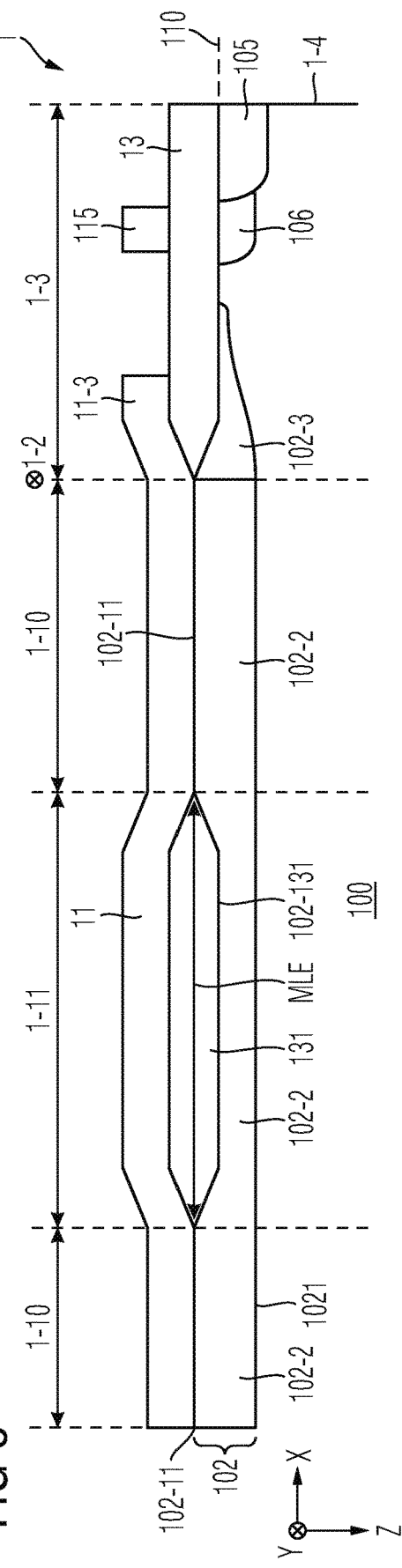

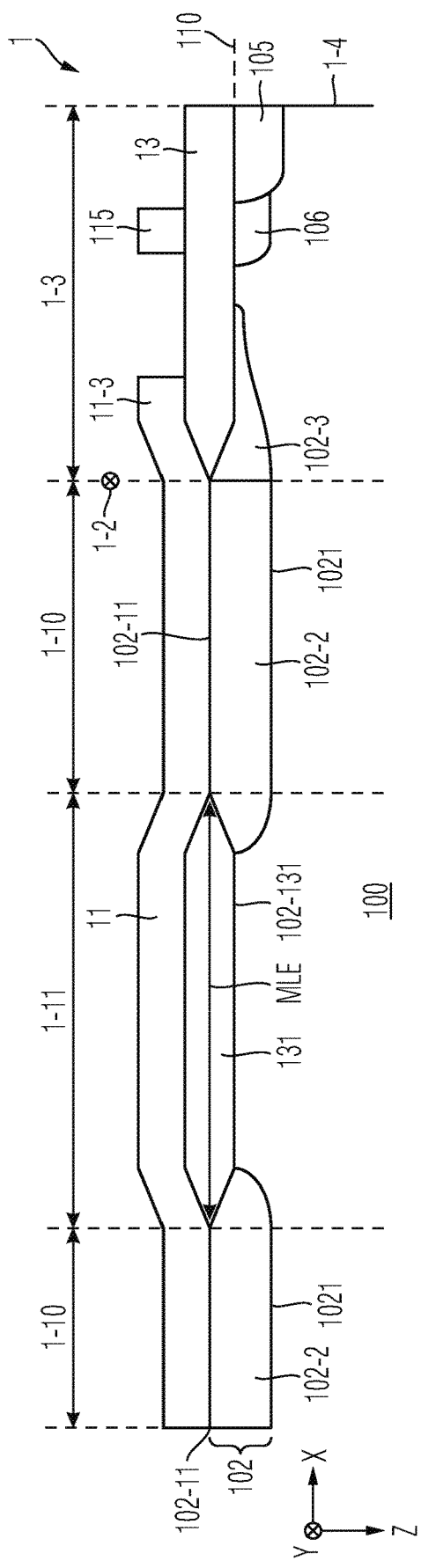

FIG 16
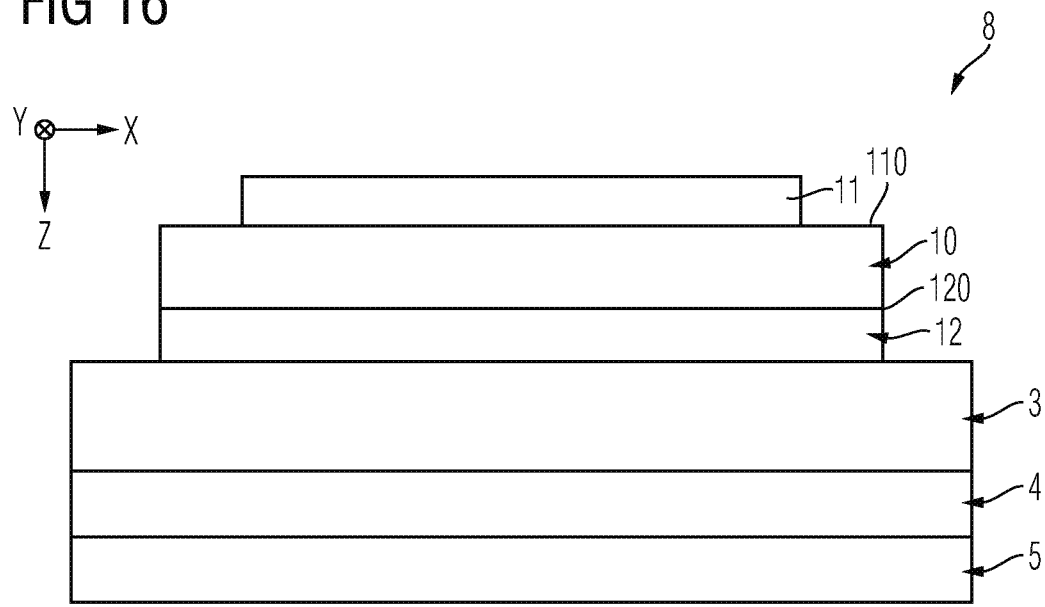
(1)
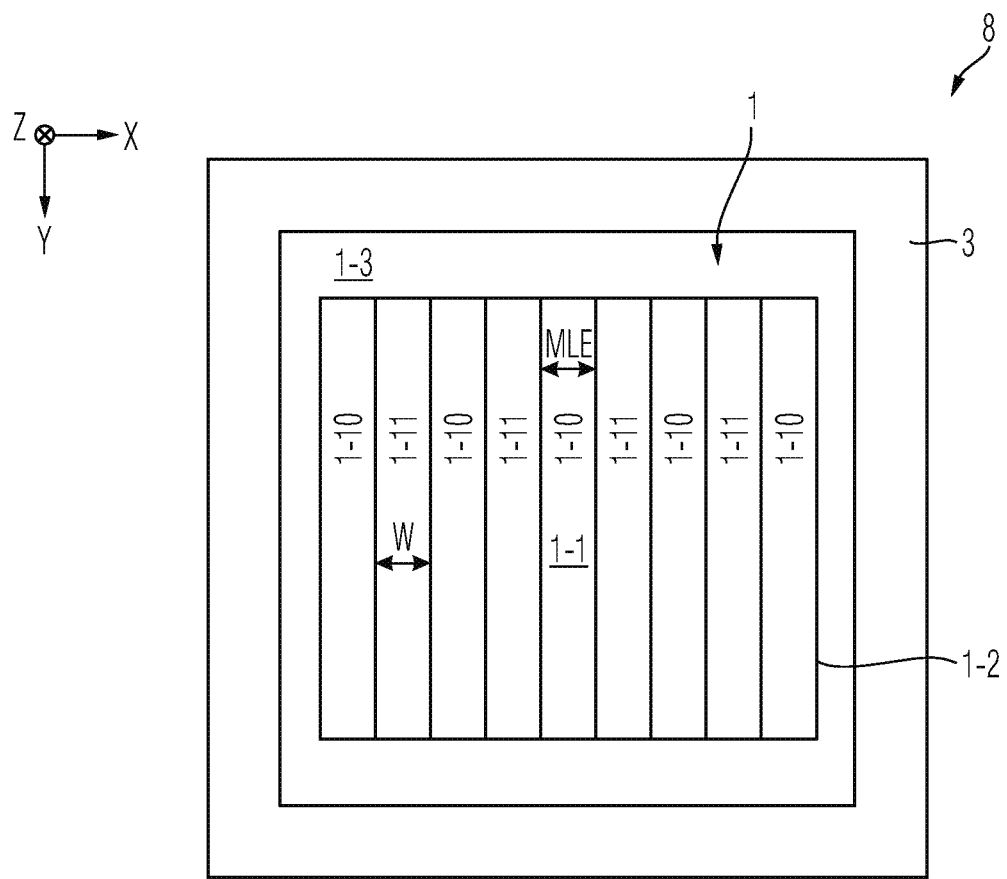
(2)

SINGLE CHIP POWER DIODE AND METHOD OF PRODUCING A SINGLE CHIP POWER DIODE

TECHNICAL FIELD

This specification refers to embodiments of a single chip power diode and to embodiments of a method of processing a single chip power diode. In particular, this specification is related to embodiments of a diode for fast switching applications.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor or controllable diode, the load current path may be controlled by means of an insulated electrode, commonly referred to as gate electrode. For example, upon receiving a corresponding control signal from, e.g., a driver unit, the control electrode may set the power semiconductor device in one of a forward conducting state and a blocking state.

A typical power semiconductor device is a power diode, the principle configuration of which is known to the skilled person.

Typical design goals for power diodes include high current carrying capability, low reverse recovery losses and a so-called diode softness. At the time, thermal constraints must be fulfilled.

Sometimes, a switching loss reduction of a power diode for a fast switching application is achieved by using carrier lifetime killing techniques, like platinum doping in the drift zone of the power diode, and/or carrier concentration reduction through damage implantation of, e.g., Argon or Helium, in the anode and/or cathode emitter. According to another approach, the cathode of the diode is structured. However, some drawbacks with these approaches may be observed:

For example, damage implants bear the risk of increased leakage current. By using the platinum doping, the temperature coefficient of the diode forward voltage becomes more negative which limits the possibility of connecting the diode in parallel to another power semiconductor device. Further, a recombination efficiency of platinum doping is reduced at elevated temperature leading to increased stored charge and switching losses. And, by using a structured cathode, the carrier concentration at the backside can be reduced which may lead to worse diode softness performance.

SUMMARY

According to an embodiment, a single chip power diode comprises: a first load terminal, a second load terminal and, between the first load terminal and the second load terminal, a semiconductor body comprising an anode region coupled to the first load terminal, a cathode region coupled to the second load terminal and, between the anode region and the cathode region, a drift region; an active region configured to conduct a load current between the load terminals based on the anode region, the drift region and the cathode region, wherein a thickness of the semiconductor body is defined by a distance between at least one first interface area formed between the first load terminal and the anode region and a second interface area formed between the second load terminal and the cathode region; an edge termination region surrounding the active region and being terminated by a chip edge. At least one inactive subregion is included in the active region, each inactive subregion: having a blocking area with a minimal lateral extension of at least 20% of a drift region thickness; being configured to prevent crossing of the load current between the first load terminal and the semiconductor body through said blocking area; and being at least partially not arranged adjacent to the edge termination region.

According to a further embodiment, a power semiconductor housing includes one or more single chip power diodes in accordance with the preceding paragraph.

According to another embodiment, a method of producing a single chip power diode comprises forming the following components: a first load terminal, a second load terminal and, between the first load terminal and the second load terminal, a semiconductor body comprising an anode region coupled to the first load terminal, a cathode region coupled to the second load terminal and, between the anode region and the cathode region, a drift region; an active region configured to conduct a load current between the load terminals based on the anode region, the drift region and the cathode region, wherein a thickness of the semiconductor body is defined by a distance between at least one first interface area formed between the first load terminal and the anode region and a second interface area formed between the second load terminal and the cathode region; an edge termination region surrounding the active region and being terminated by a chip edge. The method further comprises including at least one inactive subregion in the active region, each inactive subregion: having a blocking area with a minimal lateral extension of at least 20% of a drift region thickness; being configured to prevent crossing of the load current between the first load terminal and the semiconductor body through said blocking area; and being at least partially not arranged adjacent to the edge termination region.

The proposed embodiments include the recognition that at a diode with a weak anode, the stored charge density at the anode side is increasing approximately with the square root of the current density. In general, a weak anode is desired for low charge density at the anode comes along with low peak reverse recovery current (which would yield low turn-on-losses of an IGBT connected in parallel thereto). On the side of the cathode, the carrier density is increasing approximately linearly with the current density. For softness during switching, a carrier density is desired which has a higher concentration at the cathode side which can be more easily achieved at higher current density. Thus, for better dynamic performance of a diode, higher current density is preferred since it eases soft recovery and shows lower switching losses.

In accordance with embodiments described herein, only a part of the diode chip area is made electrically active; e.g., a local current density may be higher compared to the conventional diode. A rest of the diode chip area works as thermal conductor/capacitor which ensures a favorable thermal performance. In this way, the active area can be designed smaller compared to the conventional diode for the same current carrying capability.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIGS. 5-11 each schematically and exemplarily illustrate a section of a vertical cross-section of a diode in accordance with some embodiments;

FIG. 16 schematically and exemplarily illustrates a section of a vertical cross-section and a section of a horizontal projection of a diode contained in a power semiconductor housing in accordance with one or more embodiments.

DETAILED DESCRIPTION

Figure 1:
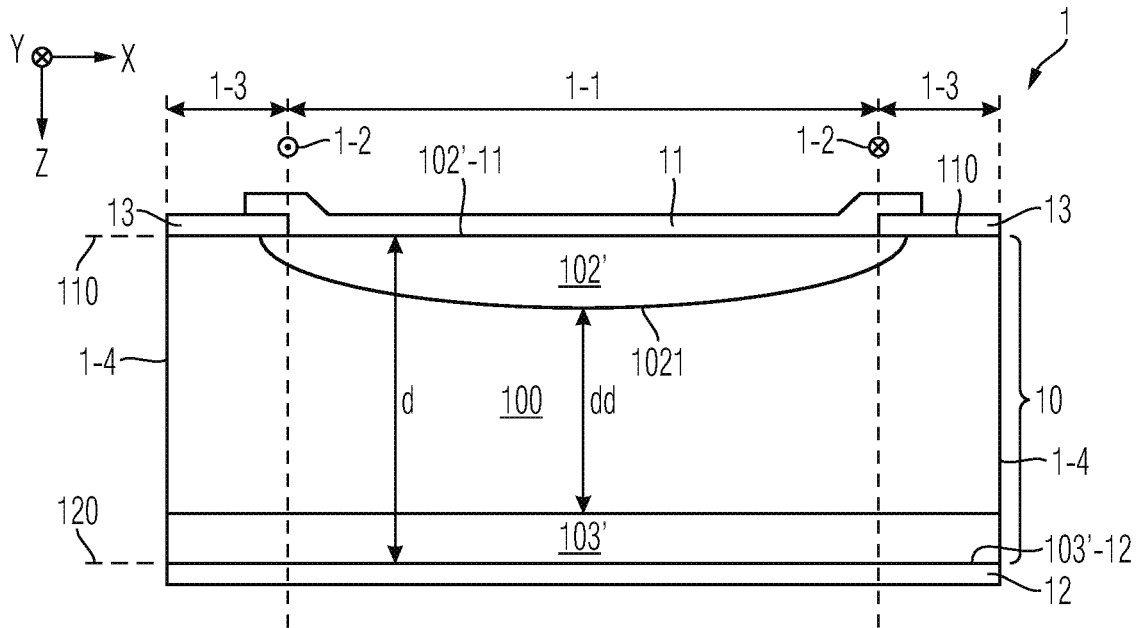
FIG. 1 schematically and exemplarily illustrates a section of a vertical cross-section of a diode.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, and/or a derivative of a monolithically integrated diode cell (e.g., a monolithically integrated cell of two anti-serially connected diodes). Such diode cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., up to at least 3 kV, or even up to 10 kV or more.

For example, the power semiconductor device described below may be a single semiconductor chip can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

The present specification in particular relates to power semiconductor devices embodied as respective diodes.

Figure 2:
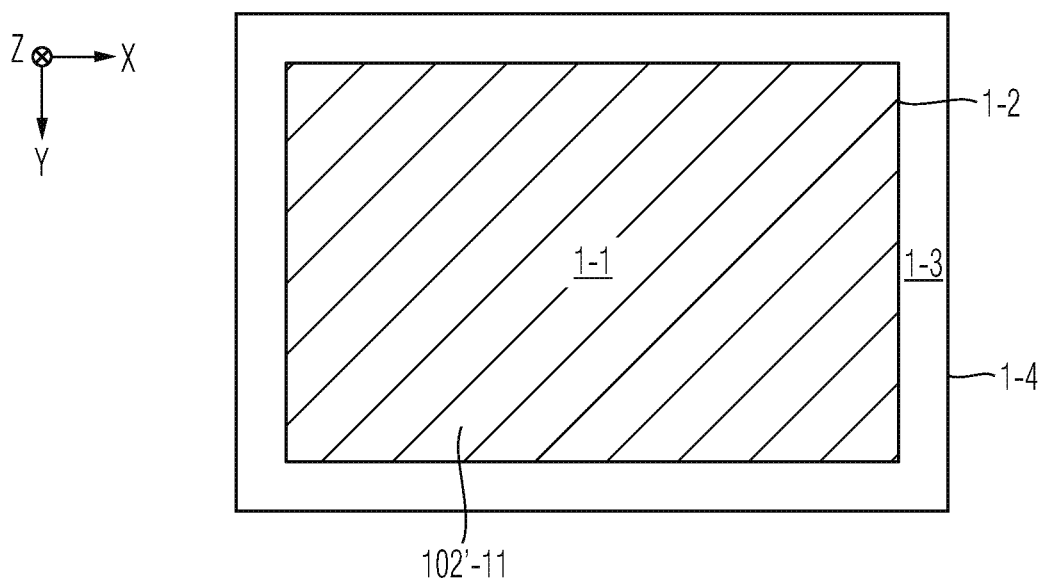
FIG. 2 schematically and exemplarily illustrates a section of a horizontal projection of a diode.

FIG. 1 schematically and exemplarily illustrates a section of a vertical cross-section of a single chip power diode 1 (herein also referred to as diode 1). Referring also to FIG. 2, the diode 1 has an active region 1-1. An edge termination region 1-3 of the diode 1 surrounds the active region 1-1. Hence, the edge termination region 1-3 can be arranged external of the active region 1-1. The edge termination region 1-3 is laterally terminated by an edge 1-4. The edge 1-4 may form the chip edge of the diode 1.

As used herein, the terms "edge termination region" and "active region" are both associated with the respective technical meaning the skilled person typically associates therewith in the context of power semiconductor devices. That is, the active region 1-1 is primarily configured for load current conduction, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-1.

Referring to FIG. 1 again, the diode 1 has a semiconductor body 10 having a frontside 110 and a backside 120. The frontside 110 (herein also referred to as semiconductor body surface) and the backside 120 may vertically terminate the semiconductor body 10. That is, the semiconductor body 10 has a total thickness d along the vertical direction Z between the frontside 110 and the backside 120. In the lateral directions, the semiconductor body 10 may be terminated by the edge 1-4. Furthermore, both the frontside 110 and the backside 120 may extend laterally along both the first lateral direction X and the second lateral direction Y. For example, both the frontside 110 and the backside 120 may form a respective quasi horizontal surface of the semiconductor body 10. The thickness d of the semiconductor body 10 may be the distance between the frontside 110 and the backside 120 along the vertical direction Z in the active region 1-1, e.g., measured at a center of the active region 1-1. Another definition of the thickness d of the semiconductor body 10 is given below.

The semiconductor body 10 and a drift region 100 thereof form a part of both the active region 1-1 and the edge termination region 1-3. The semiconductor body 10 is, in the active region 1-1 configured to conduct a forward load current between a first load terminal 11 and a second load terminal 12.

A first load terminal 11 is arranged at the semiconductor body frontside 110 and a second load terminal 12 is arranged at the semiconductor body backside 120. For example, the first load terminal 11 comprises a frontside metallization and/or the second load terminal 12 comprises a backside metallization. For example, the first load terminal 11 is an anode terminal and the second load terminal 12 is a cathode terminal. At the frontside 110, the semiconductor body 10 may interface with the frontside metallization. At the backside 120, the semiconductor body 10 may interface with the backside metallization.

In an embodiment, the first load terminal 11 (e.g., said frontside metallization) laterally overlaps, that is, along the first lateral direction X and/or the second lateral direction Y and/or combinations thereof, with the active region 1-1. It shall be noted that the first load terminal 11 may be laterally structured. Analogously, in an embodiment, the second load terminal 12 (e.g., said backside metallization) laterally overlaps, that is, along the first lateral direction X and/or the second lateral direction Y and/or combinations thereof, with the active region 1-1. It shall be noted that the second load terminal 12 is typically not structured but formed homogenously and monolithically at the semiconductor body backside 120, e.g., so as to establish a laterally homogeneous contact with the semiconductor body 10 at the backside 120. Such homogenous structure may also be implemented in regions where the second load terminal 12 laterally overlaps with the edge termination region 1-3.

For example, the lateral boundary of the active region 1-1 is defined by the lateral boundary of the outermost structure of the semiconductor body 10 that allows carrying the load current and that is electrically connected to both the first load terminal 11 and the second load terminal 12. For example, the lateral boundary of the active region 1-1 may be defined at the frontside 110. This lateral boundary can be defined by an outermost portion of an anode region 102' (cf. explanation in more detail below). For example, all functional elements to enable conduction of the load current are present in a vertical projection of the active region 1-1 of the diode 1, e.g., including at least the first load terminal 11 (e.g., a frontside metal contact thereof), the portion of the anode region 102', a drift region 100, a portion of a cathode region 103', and the second load terminal 12 (e.g., a backside metal thereof). Of course, the diode 1 may be equipped with further semiconductor regions in the semiconductor body 10, e.g., a field stop layer (not illustrated) between the cathode region 103' and the drift region 100.

In an embodiment, the edge termination region 1-3 and the active region 1-1 may be symmetrically arranged to one another, e.g., with respect two (non-illustrated) central vertical planes of the power semiconductor device 1, as it is exemplarily and schematically illustrated in FIG. 2.

Furthermore, the lateral transition between the active region 1-1 and the edge termination region 1-3 may extend exclusively along the vertical direction Z, in accordance with an embodiment. As explained above, the lateral boundary of the active region 1-1 may be defined at the frontside 110, and a vertical projection along the vertical direction Z of such defined lateral boundary may hence be observed at the backside 120.

Returning to FIG. 1, an exemplary configuration of the diode 1 shall be described. The semiconductor body 10 comprises the anode region 102' coupled to the first load terminal 11, the cathode region 103' coupled to the second load terminal 12 and, between the anode region 102' and the cathode region 103' the drift region 100.

The active region 1-1 is configured to conduct the load current between the load terminals 11, 12 based on the anode region 102', the drift region 100 and the cathode region 103'. A thickness of the semiconductor body 10 can also be defined as the distance d between at least one first interface area 102'-11 formed (at the frontside 110) between the first load terminal 11 and the anode region 102' and a second interface area 103'-12 formed (at the backside 120) between the second load terminal 12 and the cathode region 103'.

The anode region 102' may be of the second conductivity type. Both the drift region 100 and the cathode region 103' may be of the first conductivity type, wherein the cathode region 103' typically has a higher dopant concentration as the drift region 100. The anode region 102' may be arranged in electrical contact with the first load terminal 11.

A major part of the semiconductor body 10 is formed as the drift region 100 of the first conductivity type, which interfaces with the body region 102' and forms a pn-junction 1021 therewith. As illustrated in FIG. 1, the anode 102' extends from the frontside 110 along the vertical direction Z until it interfaces with the drift region 100. The drift region 100 extends for a longer range along the vertical direction Z until it interfaces with the cathode region 103'. The cathode region 103' is arranged in electrical contact with the second load terminal 12, as illustrated in FIG. 1.

In a conventional diode, as illustrated in FIG. 2, there is only one first interface area 102'-11 formed (at the frontside 110) between the first load terminal 11 and the anode region 102' that extends contiguously throughout the entire active region 1-1.

The above described basic configuration of the diode 1 is as such known to the skilled person. The embodiments described herein do not deviate from generally known aspects regarding diodes, but are, inter alia, related to a novel design regarding the contact between the first load terminal 11 and the anode region 102'. As in particular these aspects and, optionally, the cathode region 103' may be modified in accordance with the embodiments disclosed herein, in the subsequent description, the anode region will be referred to with reference numeral 102, and the cathode region with reference numeral 103 (and the first/second interface area(s) with reference numerals 102-11 and 103-12, receptively), whereas the other reference numerals introduced above do not designate components that necessarily differ from those introduced with respect to FIGS. 1-2 and are accordingly used in the same manner below.

Figure 3:
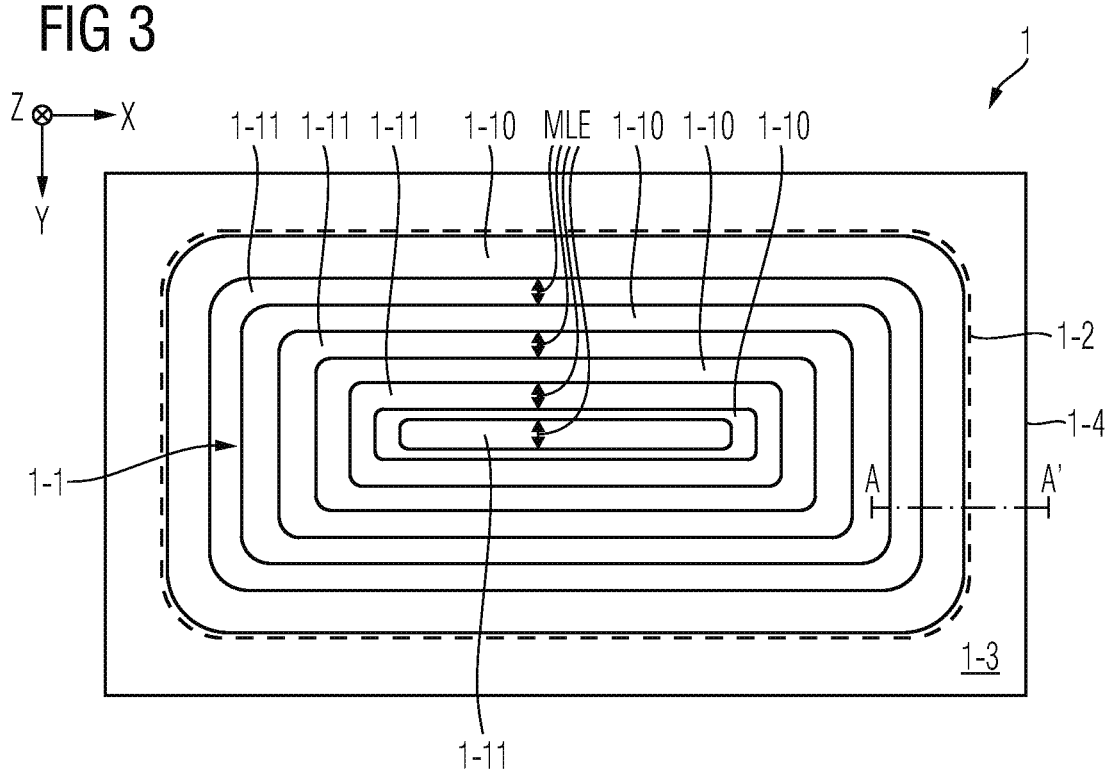
FIGS. 3-4 both schematically and exemplarily illustrate a section of a horizontal projection of a diode in accordance with some embodiments.
Figure 4:
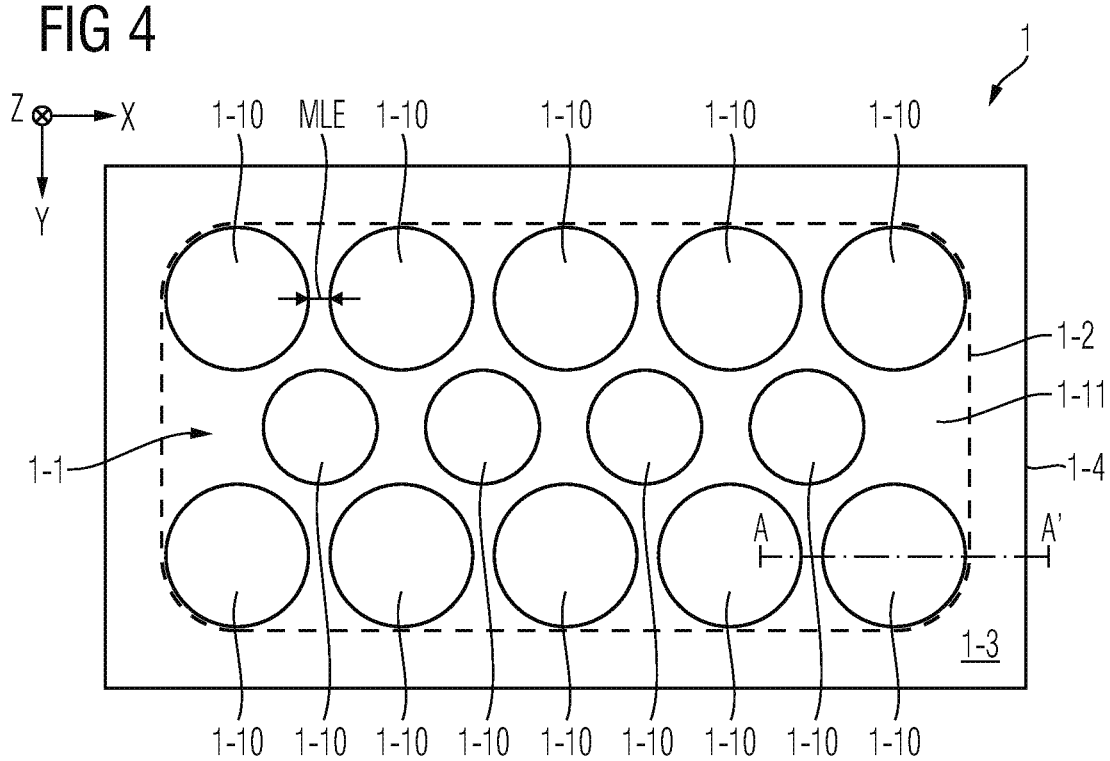

FIGS. 3-4 both schematically and exemplarily illustrate a section of a horizontal projection of a diode 1 in accordance with one or more embodiments. The diode 1 is a single chip power diode 1 and comprises: the first load terminal 11, the second load terminal 12 and, between the first load terminal 11 and the second load terminal 12, the semiconductor body 10 comprising the anode region 102 (cf. FIG. 5 et seq.) coupled to the first load terminal 11, the cathode region 103 (cf. FIG. 5 et seq.) coupled to the second load terminal 12 and, between the anode region 102 and the cathode region 103, the drift region 100; the active region 1-1 configured to conduct the load current between the load terminals 11, 12 based on the anode region 102, the drift region 100 and the cathode region 103, wherein the thickness of the semiconductor body 10 is defined by a distance d between the at least one first interface area 102-11 formed between the first load terminal 11 and the anode region 102 (cf. FIG. 5 et seq.) and the second interface area 103-12 formed between the second load terminal 12 and the cathode region 103; the edge termination region 1-3 surrounding the active region 1-1 and being terminated by the chip edge 1-4. At least one inactive subregion 1-11 is included in the active region 1-1, each inactive subregion 1-11: having a blocking area 102-131 (cf. FIG. 5 et seq.) with a minimal lateral extension MLE of at least 20% of a drift region thickness dd; being configured to prevent crossing of the load current between the first load terminal 11 and the semiconductor body 10 through said blocking area 102-131; and being at least partially not arranged adjacent to the edge termination region 1-3.

In an embodiment, diode 1 is integrated on a single chip and does not include any transistor functionality. For example, diode 1 does not include any IGBT section or the like, but is a "diode-only" device.

Figure 8:
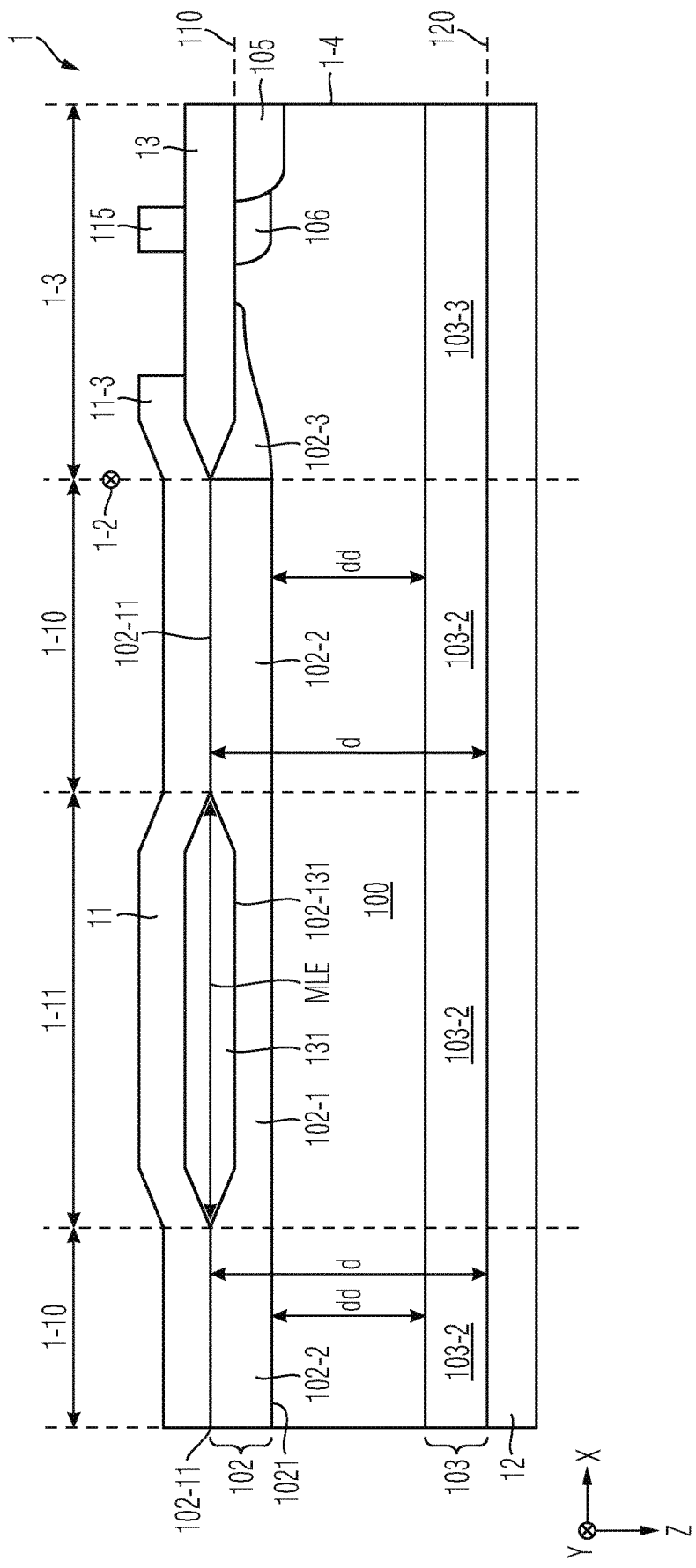

For example, the drift region thickness dd is the thickness of the drift region 100 measured as the vertical distance between the pn-junction 1021 and a transition between the cathode region 103 (or, respectively, the stack of a (non-illustrated) field stop region and the cathode region 103) and the drift region 100, e.g., not in the inactive subregion 1-11, but in an active subregion 1-10 (cf. FIG. 8). For example, the drift region thickness dd amounts to at least 25% of the semiconductor body thickness d or to even more than 95% of the semiconductor body thickness d (e.g., in case a wafer thinning process has been applied). In an embodiment, the transition between the drift region 100 and the cathode region 103 (or, respectively, the boundary between the drift region 100 and the stack of the (non-illustrated) field stop region and the cathode region 103) is at a vertical level where the dopant concentration of dopants of the first conductivity type has increased, along the vertical direction Z, to a value of $1*10^{17}$ cm$^{-3}$.

At least one inactive subregion 1-11 is included in the active region 1-1. For example, in accordance with FIG. 4, the diode 1 includes only one inactive subregion 1-11 extending contiguously within the active region 1-1. In accordance with FIG. 3, the diode 1 includes several inactive subregions 1-11 in the active region 1-1.

For example, each of the one or more inactive subregions 1-11 may include a respective blocking area 102-131 (cf. FIG. 5 et seq.) with a minimal lateral extension MLE of at least 20% of the drift region thickness dd. For example, each of the at least one inactive subregion 1-11 comprises an insulation layer 131 (cf. FIG. 5 et seq.), wherein the insulation layer 131 forms the blocking area 102-131 of the at least one inactive subregion 1-11. That is: The load current cannot cross from the first load terminal 11 to the semiconductor body 10 (or vice versa) via said blocking area 102-131; rather, the load current must follow a path including a section of the at least one first interface area 102-11.

For example, the insulation layer 131 comprises or is made of a silicon oxide, silicon nitride, silicon oxynitride or another insulating material and/or has a thickness in a range of approximately 100 nm to 3 µm or approximately 0.5 µm to 2 µm.

The minimal lateral extension MLE of each blocking area 102-131 may amount to at least 20%, to at least 50%, to at least 100% or to even more than 200% of the drift region thickness dd. In an embodiment, the minimal lateral extension MLE of each blocking area 102-131 may amount to at least 20%, to at least 50%, to at least 100% or to even more than 200% of the semiconductor body thickness d. For example, in the example according to FIG. 16, MLE amounts to approximately four times the semiconductor body thickness d.

For example, a minimal lateral extension of the insulation layer 131 also amounts to the value MLE given above.

The active region 1-1 may include one or more active subregions 1-10. For example, if several active subregions 1-10 are provided, theses may be separated from each other based on the one or more inactive subregions 1-11, e.g., by a distance amounting to at least the minimal lateral extension MLE of the respective blocking area 102-131. For example, said at least first interface area 102-11 is formed in the one or more active subregions 1-10.

As illustrated in both FIGS. 3 and 4, each of the one or more inactive subregions 1-11 is at least partially not arranged adjacent to the edge termination region 1-3; rather, the transition between the edge termination region 1-3 and the active region 1-1 is at least partially constituted by a transition between the edge termination region 1-3 and at least one of the one or more active subregions 1-10. Thus, for example, the lateral area of the active region 1-1 may be defined by an envelope 1-2 surrounding outermost sections of the at least one first interface area 102-11 in the active region 1-1.

In accordance with embodiments described herein, the total lateral area of the active region 1-1 may be separated into one or more first interface areas 102-11 that allow crossing of the load current between the first load terminal 11 and the semiconductor body 10, and into one or more blocking areas 102-131 that do not allow such crossing. For example, the sum of the one or more first interface areas 102-11 and the one or more blocking areas 102-131 amounts to the lateral area of the active region 1-1.

For example, the sum of one or more the first interface areas 102-11 is within the range of 10% to 90% of the lateral area of the active region 1-1. Further, the sum of one or more blocking areas 102-131 is within the range of 10% to 90% of the lateral area of the active region 1-1.

A plurality of different design options are possible to accordingly arrange the at least one inactive subregion 1-11 and the at least one active subregion 1-10 in the active region 1-1, wherein FIGS. 3 and 4 only schematically illustrate two exemplary options. For example, embodiments observe at least one of the following design constraints:

(i) the sum of each of at least one first interface area 102-11 amounts to at least 10% in total of the lateral area of the active region 1-1 and to no more than 90% in total of the lateral area of the active region 1-1; and/or (ii) the sum of each of at least one blocking area 102-131 amounts to at least 10% in total of the lateral area of the active region 1-1 and to no more than 90% in total of the lateral area of the active region 1-1; and/or (iii) each of at least 90% of the active subregions 1-10 has a respective first interface area 102-11 and has an area with a minimum lateral extension of at least 20%, 50%, 100% or 200% of the drift region thickness dd; and/or (iv) each of at least 90% of the one or more inactive subregions 1-11 has a respective blocking area 102-131 and has an area with a minimum lateral extension MLE of at least 20%, 50%, 100% and 200% of the drift region thickness dd.

That is, in accordance with one or more embodiments, a substantial portion of the active area is occupied by the one or more inactive subregions 1-11 that do not allow crossing of the load current between the first load terminal 11 and the semiconductor body 10, i.e., no such crossing is possible at the respective blocking area 102-131.

As indicated above, a plurality of design options is available. For example, instead of the separated active subregions 1-10 in FIG. 3, each having a substantially rectangular shape, there could also be a single contiguous active subregion 1-10 having a meander-like course, and a correspondingly designed single contiguous inactive subregion 1-11. Furthermore, the circular structures shown in FIG. 4 could be replaced by ellipsoidal structures. Also, a stripe pattern is possible where for example a respective active subregion 1-10 has a stripe configuration and two laterally adjacent inactive subregions 1-11 also having a stripe configuration (cf. FIG. 16, part (2)).

Hence, if for example more than one inactive subregion 1-11 is provided, the inactive subregions 1-11 may be arranged between or around the spatially separated active subregions 1-10, in accordance with an embodiment.

Irrespective of the actual positioning and dimensioning of the one or more active subregions 1-10 and the one or more inactive subregions 1-11, in accordance with some embodiments described herein, an anode efficiency of the single chip power diode 1 is spatially modulated within the active region 1-1, e.g., based on the blocking area(s) 102-131 of the at least one inactive subregion 1-11 in the active region 1-1. An additional spatial modulation may be achieved by a lateral structure of the anode region 102 and/or a lateral structure of the cathode region 103, as will be described further below.

FIGS. 5-11 each schematically and exemplarily illustrate a section of a vertical cross-section of the diode 1 in accordance with some embodiments. Each of the FIGS. 5-11 shows a vertical cross-section that may correspond, for example, to a right portion of the embodiments illustrated in FIGS. 3-4, e.g., a vertical cross-section along cut line A-A' indicated in FIGS. 3-4.

Accordingly, starting at the respective right portion of FIGS. 5-11, the chip edge 1-4 laterally terminates the edge termination region 1-3 of the diode 1. At the frontside 110, the edge termination region 1-3 may exhibit an insulation structure 13 (as also shown in FIG. 1), which may be conventionally designed. Exemplarily, an extension 102-3 of the anode region 102 may extend from the active region 1-1 into the edge termination region 1-3 below the insulation structure 13. Furthermore, doped semiconductor portions 105, 106 of the first or second conductivity type may be provided at an outermost portion of the edge termination structure 1-3 and in contact with the insulation structure 13, e.g., to form a channel stopper. Furthermore, an electrically conductive runner structure 115 may be arranged on the insulation structure 13. Other designs of the edge termination region 1-3 are possible.

As the anode region 102, the first load terminal 11 may exhibit an extension 11-3 that may extend from the active region 1-1 into the edge termination region 1-3, but above the insulation structure 13. But, based on the insulation structure 13, transition of the load current between the semiconductor body 10 and the first load terminal is not possible in the edge termination region 1-3, according to an embodiment.

The first load terminal 11. e.g., a frontside metallization thereof, may contiguously extend throughout the entire area of the active region 1-1. For example, the entire area confined by envelope 1-2 (cf. also FIGS. 3 and 4) is covered by the frontside metallization of the first load terminal 11.

In each of the one or more active subregions 1-10, the first load terminal 11 interfaces with the anode region 102, e.g., with emitter portions 102-2 thereof, thereby forming the one or more first interface areas 102-11 that allow for the load current crossing.

In each of the one or more inactive subregions 1-11, the first load terminal 11 interfaces with the respective insulation layer 131, which in turn interfaces with the semiconductor body 10, e.g., also with the anode region 102, e.g., with structure portions 102-1 (cf. e.g. FIG. 5) thereof, thereby forming the one or more blocking areas 102-131 that do not allow for the load current crossing.

With respect to FIG. 8, the anode region 102 interfaces with the drift region 100, thereby forming the pn-junction 1021. The drift region 100 extends along the vertical direction Z until interfacing the with cathode region 103, which is arranged in electrical contact with the second load terminal 12, thereby forming said second interface area 103-12. As the anode region 102, the cathode region 103 may have emitter portions 103-2 and structure portions 103-1 (cf. e.g. FIG. 9) in the active region 1-1, as well as an extension 103-3 extending into the edge termination region 1-3, as illustrated in FIG. 8.

As indicated above, a spatial modulation of the behavior of the diode 1 may be achieved by a corresponding design of the anode region 102 and/or of the cathode region 103, a few examples being presented below:

Generally speaking, in the active region 1-1, the anode region 102 may be laterally structured. Additionally or alternatively, the cathode region 103 can be laterally structured. The lateral structures of these regions may be chosen in correspondence of the lateral structure of the active region 1-1 based on the inactive subregion(s) and active subregion (s).

Returning to FIG. 5, the anode region 102 may be structured in a way that the dopant concentration in the structure portions 102-1 (i.e., those portions of the anode region 102 that form a part of the inactive subregion(s) 1-10) is lower as compared to the dopant concentration in the emitter portions 102-2 (i.e., those portions of the anode region 102 that form a part of the active subregion(s) 1-11). Of course, such difference in dopant concentration may yield a corresponding waviness of the course of the pn-junction 1021; e.g., in the inactive subregion(s) 1-10, the pn-junction 1021 may be closer to the frontside 110 as compared to the active subregion(s) 1-11 due to the lowered dopant concentration. In an embodiment, the body region 102 does not or only slightly extend into the inactive subregion(s) 1-11, such that the no structure portions 102-1 are implemented and the pn-junction 1021 is accordingly interrupted in the first lateral direction X, as illustrated in FIG. 7. In another extreme, the anode region 102 is not structured but extends laterally with a substantially spatial homogenous dopant concentration into both the active subregions 1-10 and the inactive subregions 1-11, e.g., consisting solely of emitter portions 102-2 that seamlessly joint into each other, as illustrated in FIG. 6. Essentially, depending on the desired anode efficiency, one of said extremes is possible as well as "intermediate" solutions, such as a reduced dopant concentration in the structure portions 102-2, which may also be realized based on a respective VLD (variation of the lateral doping) design. That is, in an embodiment, the anode region 102 exhibits a VLD profile where the anode region 102 laterally overlaps with the blocking area 102-131 of the at least one inactive subregion 1-11 (e.g., with a minimal dopant concentration at a central section of the respective structure portion 102-1 and an increasing dopant concentration toward the adjacent emitter portions 102-2). Generally, the anode region 102 may exhibit a higher (average) dopant concentration where the anode region 102 laterally overlaps with the at least one first interface area 102-11 as compared to where the anode region 102 laterally overlaps with the blocking area 102-131 of the at least one inactive subregion 1-11.

Similar considerations apply with respect to the cathode region 103. In an embodiment as illustrated in FIG. 8, in the active region 1-1, the cathode region 103 is not laterally structured but consists of substantially equally doped emitter portions 103-2 that seamlessly joint into each other, forming a laterally homogenously doped cathode region 103. The extension 103-3 of the cathode region 103 may exhibit the same dopant concentration as the emitter portions 103-2 or a dopant concentration different therefrom.

Figure 9:
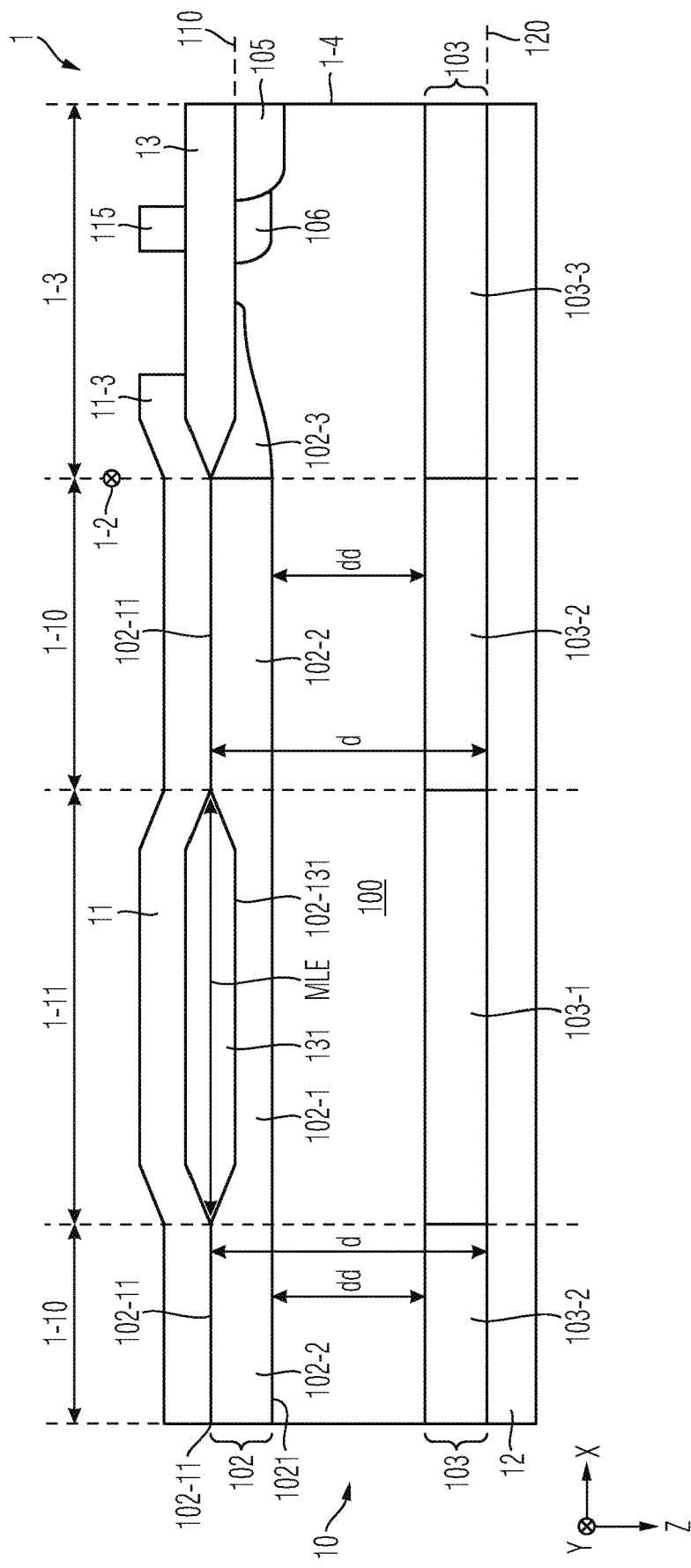

In accordance with the embodiment of FIG. 9, structure portions 103-1 of the cathode region 103 in the inactive subregion(s) 1-11 are more weakly doped as compared to the emitter portions 103-2 in the active subregion(s) 1-10. It is also possible, in other embodiments, that the structure portions 103-1 of the cathode region 103 in the inactive subregion(s) 1-11 are more strongly doped as compared to the emitter portions 103-2 in the active subregion(s) 1-10.

In an embodiment, the extension 103-3 of the cathode region 103 may exhibit a lower dopant concentration as the emitter portions 103-2. Additionally or alternatively, the structure portions 102-1 of the anode region 102 in the inactive subregion(s) 1-11 may be more weakly doped as compared to the emitter portions 102-2 of the anode region 102 in the active subregion(s) 1-10. In another embodiment, the structure portions 102-1 of the anode region 102 in the inactive subregion(s) 1-11 may be more strongly doped as compared to the emitter portions 102-2 of the anode region 102 in the active subregion(s) 1-10.

Figure 10:
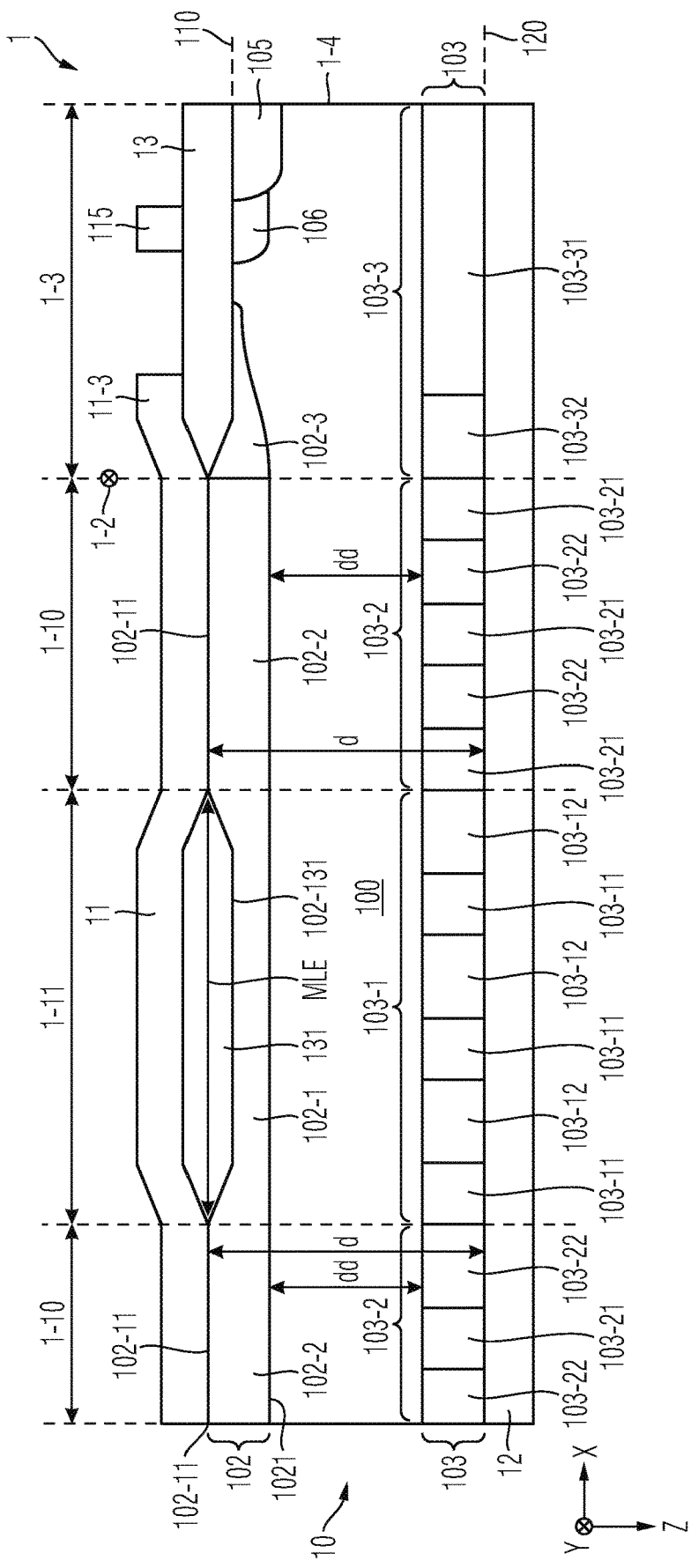
Figure 11:
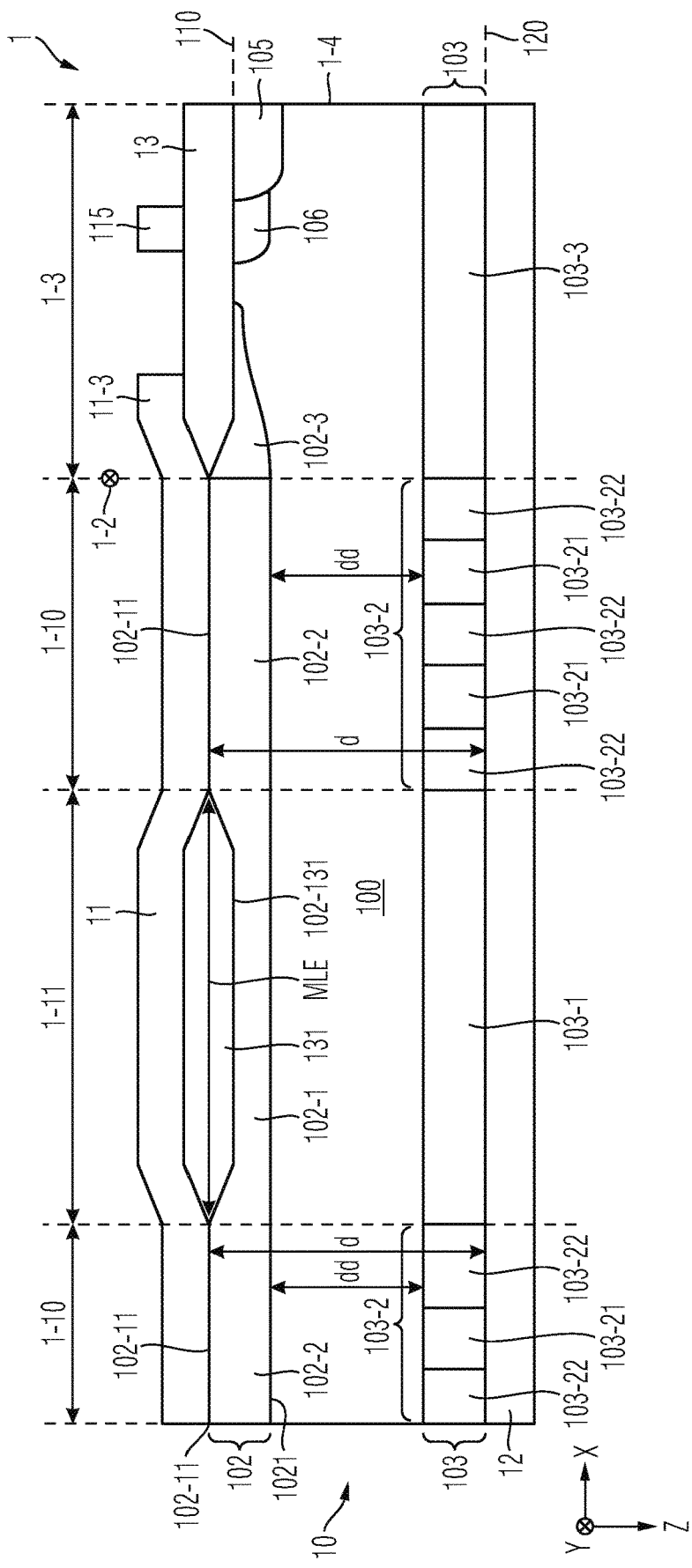

In accordance with an embodiment, as illustrated in FIGS. 10-11, the emitter portions 103-2 and/or the structure portions 103-1 of the cathode region 103 may be substructured. For example, each of the emitter portions 103-2 comprises one or more highly doped subportions 103-22 and one or more weakly doped subportions 103-21, and each of the structure portions 103-1 comprises one or more highly doped subportions 103-12 and one or more weakly doped subportions 103-11. The highly doped subportions 103-12/103-22 and the weakly doped subportions 103-11/103-21 may be arranged laterally arranged to each other and be positioned and dimensioned as appropriate for designated characteristic of the diode 1. Furthermore, also the extension 103-3 of the cathode region may comprise one or more highly doped subportions 103-32 (e.g., in a region adjacent to the active region 1-1) and one or more weakly doped subportions 103-31 (e.g., in a region adjacent to the edge 1-4).

In a yet further embodiment as illustrated in FIG. 11, the structure portion(s) 103-1 and/or the extension 103-3 of the cathode region may be of the second conductivity type, and/or the one or more weakly doped subportions 103-21 of the emitter portions 103-2 of the cathode region 103 may also be of the second conductivity type.

In another embodiment, the cathode region 103 and/or the anode region 102 are/is structured in the inactive subregion (s) 1-11, and are formed homogenously in the active subregion(s) 1-10.

Figure 12:
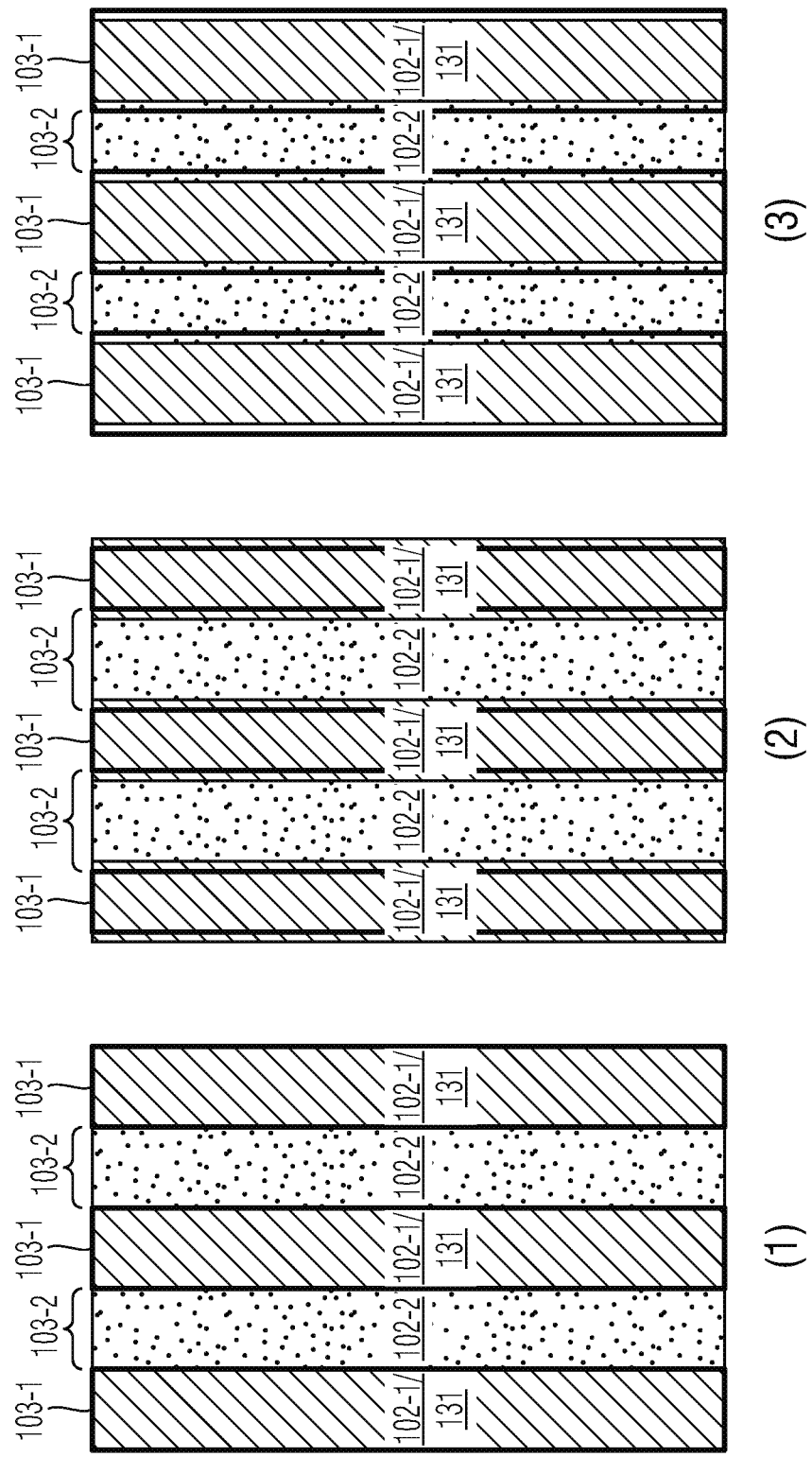
FIGS. 12-13 both schematically and exemplarily illustrate a section of a horizontal projection of a diode in accordance with some embodiments.

In accordance with an embodiment, the cathode region 103 is laterally structured in accordance with the lateral structure of the anode region 102, which is schematically illustrated in FIG. 12. For example, in accordance with a variant illustrated in part (1) of FIG. 12, the lateral pitch of the emitter portions 103-2 of the cathode region 103 are matched with the lateral pitch of the emitter portions 102-2 of the anode region 102, and the lateral dimensions of the structure portions 103-1 of the cathode region 103 are corresponding to the lateral dimension of the structure portions 102-1 of the anode region 102/the insulation layers 131 (e.g., as also shown in FIGS. 9, 10 and 11) within process variations. For example, depending on the designated characteristic of the diode 1, the emitter portions 103-2 of the cathode region 102 may also be larger in lateral terms as the emitter portions 102-2 of the anode region 102, as illustrated in part (2) of FIG. 12 (and the structure portions 103-1 of the cathode region 102 may be accordingly smaller in lateral terms as the structure portions 102-1 of the anode region 102), or vice versa, as illustrated in part (3) of FIG. 12.

Figure 13:
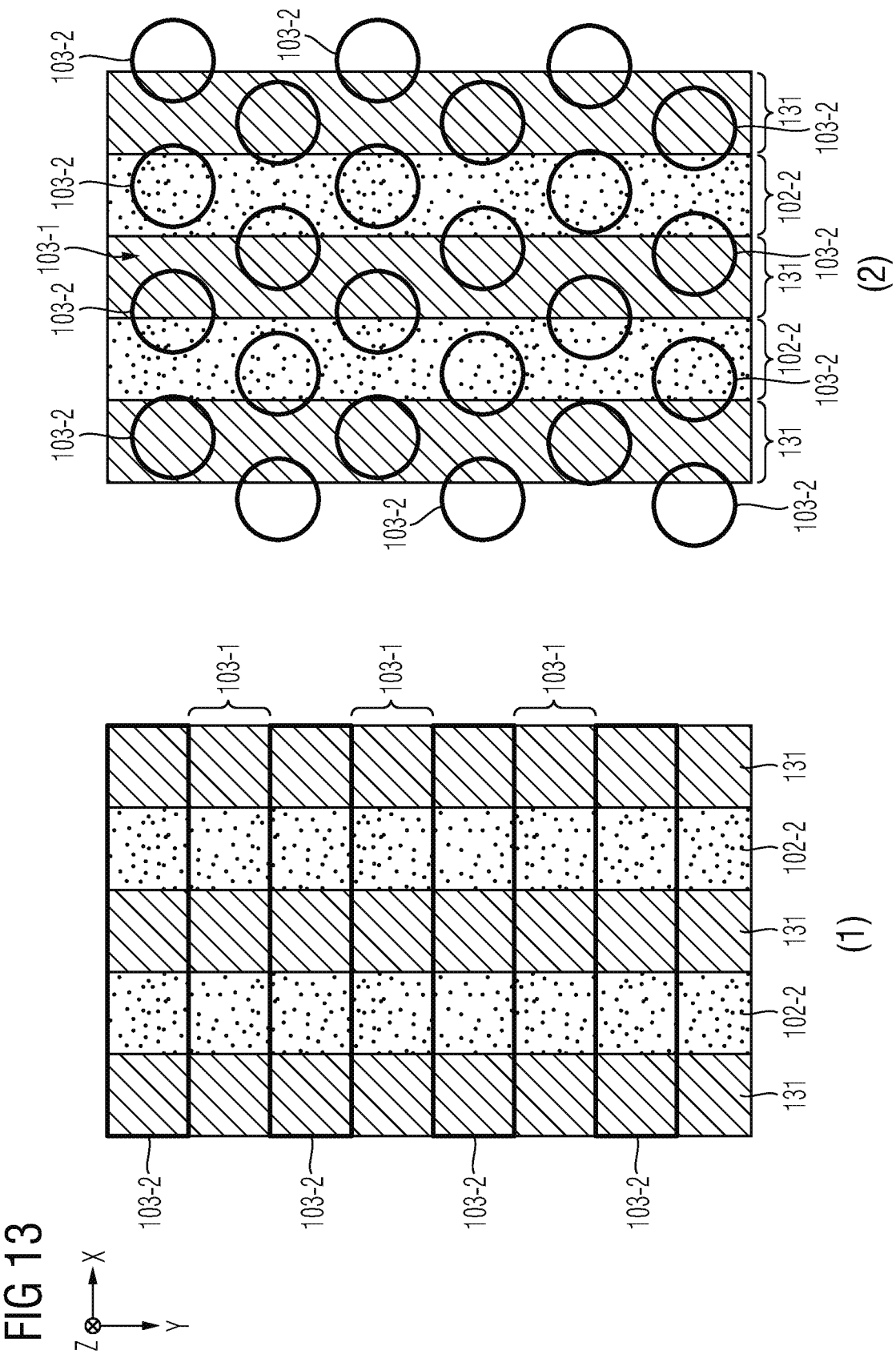

In another embodiment, the pattern of the anode region 102 and the pattern of the cathode region 103 are different from each other. For example, referring to part (1) of FIG. 13, the structure of the cathode region 103 may be orientated along a direction perpendicular to the orientation of the structure of the anode region 102, or any other angle. In another variant, the structure of the cathode region 103 may be based on circular and circular-complementary regions, whereas the structure of the anode region 102 may exhibit a stripe-like structure.

Figure 14:
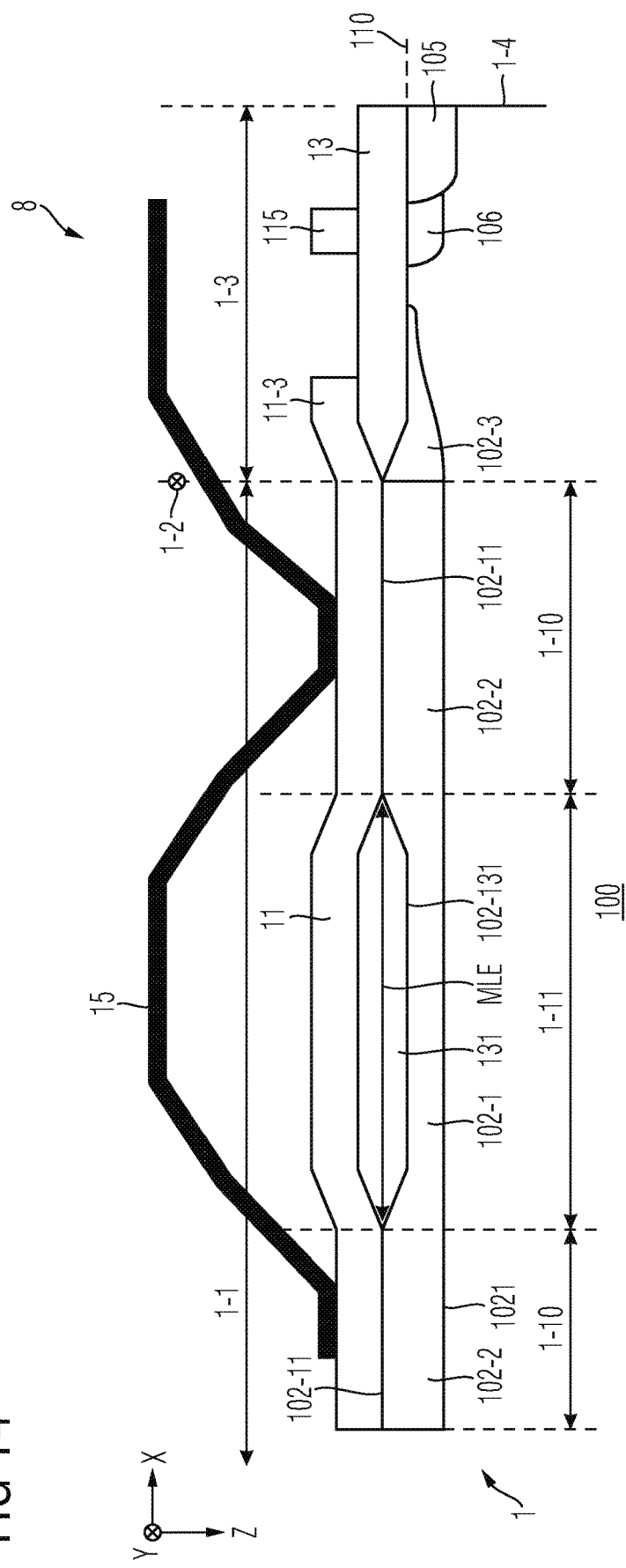
FIGS. 14-15 both schematically and exemplarily illustrate a section of a vertical cross-section of a power semiconductor housing in accordance with some embodiments.
Figure 15:
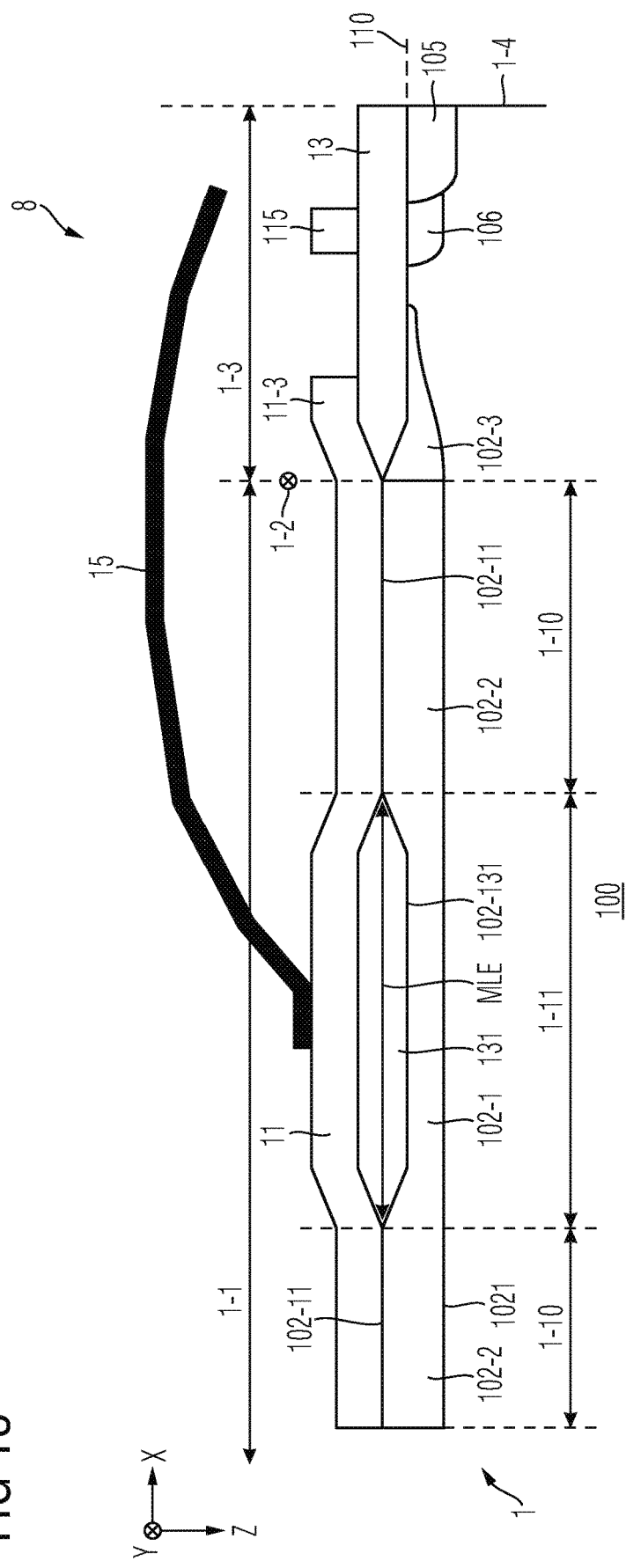

Herein presented is also a power semiconductor housing, wherein both FIGS. 14 and 15 schematically and exemplarily illustrate a section of a vertical cross-section of a power semiconductor housing 8 (i.e., only parts thereof) in accordance with some embodiments. The power semiconductor housing 8 includes one or more single chip power diodes 1 in accordance with one or more of the above described embodiments.

As described above, the first load terminal 11, e.g., a frontside metallization thereof, may extend above the insulation layer(s) 131 of the inactive subregion(s) 1-11, as also illustrated in FIGS. 14 and 15. That is, in the inactive subregion(s) 1-11, the first load terminal does not interface with the semiconductor body 10, but with the respective insulation layer 131. The insulation layer 131 may hence partially function as a support for the first load terminal 11.

The power semiconductor housing 8 may include one or more bond wires 15 for electrically contacting the first load terminal(s) 11 of the single chip power diode(s) 1. In accordance with the variant illustrated in FIG. 14, the bond wire(s) may be coupled to the first load terminals in regions corresponding to vertical projections of the active subregions 1-10. For example, the interface between the respective bond wire 15 and the respective section of the first load terminal 11 laterally overlaps with the emitter portions 102-2 of the anode region 102.

Furthermore, in an embodiment, the first load terminal 11 is laterally structured, e.g., in that the insulation layer(s) 131 is/are not covered or only partially covered by a metallization of the first load terminal 11.

In another embodiment, as illustrated in FIG. 15, the bond wire 15 is coupled, e.g., bonded, to the first load terminal 11 in a region where said lateral overlap with the insulation layer 131 is formed. Providing the bond wires 15 only at such regions may reduce the risk of damaging the semiconductor body 10 during the process of bonding. A combination of both approaches (FIG. 14 and FIG. 15) is also possible.

FIG. 16 schematically and exemplarily illustrates a section of a vertical cross-section (part (1)) and a section of a horizontal projection (part (2)) of the diode 1 as contained in the power semiconductor housing 8 in accordance with one or more embodiments. For example, the housing 8 includes a heat sink 5, a thermal coupling layer 4 (such as a thermal foil), an electrically conductive lead frame 3 (e.g., made of copper), which is coupled to backside(s) 120 of the semiconductor body/bodies 10 via the second load terminal 12, which may include a die attach layer. At the frontside(s) 110 of the semiconductor body/bodies 10, the first load terminal 11 is provided. The horizontal projection illustrated in part (2) of FIG. 16 shows a configuration of one diode 1 included in the housing 8. Accordingly, the active region 1-1, surrounded by envelope 1-2, which is surrounded by the edge termination region 1-3, is equally divided into the active and inactive subregions 1-10 and 1-11, wherein both the active subregions 1-10 and the inactive subregions 1-11 exhibit a stripe configuration and are arranged adjacent to each other in an alternating manner, as illustrated. For example, each of the active subregions 1-10 and the inactive subregions 1-11 exhibit the same width w of e.g., 400 μm, which is also the minimal lateral extension MLE identified above. For example, further dimensions are as follows:

| Layer | Thickness along Z |
|---|---|
| First load terminal 11 | 3 μm |
| Semiconductor body 10 | 100 μm |
| Second load terminal 12 | 60 μm |
| Lead frame 3 | 2 mm |
| Thermal coupling layer 4 | 150 μm |
| Heatsink 5 | 10 mm |

The housing 8 may be a discrete package and include one or more of the above describe diodes 1.

Herein presented is also a method of producing a single chip power diode, wherein the method comprises forming the following components: a first load terminal, a second load terminal and, between the first load terminal and the second load terminal, a semiconductor body comprising an anode region coupled to the first load terminal, a cathode region coupled to the second load terminal and, between the anode region and the cathode region, a drift region; an active region configured to conduct a load current between the load terminals based on the anode region, the drift region and the cathode region, wherein a thickness of the semiconductor body is defined by a distance between at least one first interface area formed between the first load terminal and the anode region and a second interface area formed between the second load terminal and the cathode region; an edge termination region surrounding the active region and being terminated by a chip edge. The method further comprises including at least one inactive subregion in the active region, each inactive subregion: having a blocking area with a minimal lateral extension of at least 20% of a drift region thickness; being configured to prevent crossing of the load current between the first load terminal and the semiconductor body through said blocking area; and being at least partially not arranged adjacent to the edge termination region.

Embodiments of the method correspond to embodiments of the diode 1 and to embodiment of the housing 8 described above.

In the above, embodiments pertaining to power semiconductor device, such as diodes, and corresponding processing methods were explained. For example, these power semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixCl-x) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A single chip power diode, comprising:
    a first load terminal, a second load terminal and, between the first load terminal and the second load terminal, a semiconductor body comprising an anode region coupled to the first load terminal, a cathode region coupled to the second load terminal and, between the anode region and the cathode region, a drift region;
    an active region configured to conduct a load current between the first and second load terminals based on the anode region, the drift region and the cathode region, wherein a thickness of the semiconductor body is defined by a distance between at least one first interface area formed between the first load terminal and the anode region and a second interface area formed between the second load terminal and the cathode region; and
    an edge termination region surrounding the active region and being terminated by a chip edge,
    wherein at least one inactive subregion is included in the active region, each inactive subregion:
        having a blocking area with a minimal lateral extension of at least 20% of a drift region thickness;
        being configured to prevent crossing of the load current between the first load terminal and the semiconductor body through the blocking area; and
        being at least partially not arranged adjacent to the edge termination region,
    wherein the anode region is laterally structured with respect to the at least one inactive subregion in the active region.

2. The single chip power diode of claim 1, wherein each of the at least one first interface area allows crossing of the load current, and wherein the sum of each of the at least one first interface area amounts to at least 10% in total of the lateral area of the active region and to no more than 90% in total of the lateral area of the active region.

3. The single chip power diode of claim 2, wherein the lateral area of the active region is defined by an envelope surrounding outermost sections of the at least one first interface area in the active region.

4. The single chip power diode of claim 1, wherein the sum of each of the at least one blocking area amounts to at least 10% in total of the lateral area of the active region and to no more than 90% in total of the lateral area of the active region.

5. The single chip power diode of claim 4, wherein the lateral area of the active region is defined by an envelope surrounding outermost sections of the at least one first interface area in the active region.

6. The single chip power diode of claim 1, wherein the at least one inactive subregion comprises an insulation layer, wherein the insulation layer forms the blocking area of the at least one inactive subregion.

7. The single chip power diode of claim 6, wherein the first load terminal laterally overlaps with the insulation layer of the at least one inactive subregion.

8. The single chip power diode of claim 1, wherein the active region has at least one active subregion, and wherein a dopant concentration of the anode region in the at least one inactive subregion is lower as compared to the dopant concentration of the anode region in the at least one active subregion.

9. The single chip power diode of claim 1, wherein the cathode region is laterally structured in the active region.

10. The single chip power diode of claim 9, wherein the cathode region is laterally structured in accordance with a lateral structure of the anode region.

11. The single chip power diode of claim 9, wherein each portion of the cathode region that forms part of the at least one inactive subregion is laterally smaller than each portion of the anode region that forms part of the at least one inactive subregion.

12. The single chip power diode of claim 1,
    wherein the anode region exhibits a higher dopant concentration where the anode region laterally overlaps with the at least one first interface area as compared to where the anode region laterally overlaps with the blocking area of the at least one inactive subregion, or
    wherein the anode region is not provided in regions laterally overlapping with the blocking area of the at least one inactive subregion.

13. The single chip power diode of claim 1, wherein the cathode region exhibits a higher dopant concentration where the cathode region laterally overlaps with the at least one first interface area as compared to where the cathode region laterally overlaps with the blocking area of the at least one inactive subregion.

14. The single chip power diode of claim 1, wherein an anode efficiency of the single chip power diode is spatially modulated within the active region.

15. The single chip power diode of claim 1, wherein the blocking area of the at least one inactive subregion in the active region structures the active region into at least two spatially separated active subregions.

16. The single chip power diode of claim 15, wherein a distance between each arbitrary two of the at least two spatially separated active subregions amounts to the minimum lateral extension.

17. The single chip power diode of claim 15, wherein more than one inactive subregion is included in the active region, wherein the inactive subregions are arranged between or around the spatially separated active subregions.

18. The single chip power diode of claim 15, wherein each of at least 90% of the active subregions has a respective first interface area and has an area with a minimum lateral extension of at least 20% of the drift region thickness.

19. The single chip power diode of claim 1, wherein only one inactive subregion extends contiguously in the active region.

20. The single chip power diode of claim 1, wherein each of at least 90% of the one or more inactive subregions has a respective blocking area and has an area with a minimum lateral extension of at least 20% of the drift region thickness.

21. The single chip power diode of claim 1, wherein the sum of one or more of the first interface areas and the one or more blocking areas amounts to the lateral area of the active region.

22. A power semiconductor housing including one or more of the single chip power diodes of claim 1.

23. The power semiconductor housing of claim 22, further comprising a bond wire, wherein the first load terminal of the one or more of the single chip power diodes laterally overlaps with the respective insulation layer of the at least one inactive subregion, and wherein the bond wire is coupled to the first load terminal of the one or more of the single chip power diodes in a region where the lateral overlap with the respective insulation layer is formed.

24. The single chip power diode of claim 9, wherein each portion of the cathode region that forms part of the at least one inactive subregion is laterally larger than each portion of the anode region that forms part of the at least one inactive subregion.

25. A single chip power diode, comprising:
a first load terminal, a second load terminal and, between the first load terminal and the second load terminal, a semiconductor body comprising an anode region coupled to the first load terminal, a cathode region coupled to the second load terminal and, between the anode region and the cathode region, a drift region;
an active region configured to conduct a load current between the first and second load terminals based on the anode region, the drift region and the cathode region, wherein a thickness of the semiconductor body is defined by a distance between at least one first interface area formed between the first load terminal and the anode region and a second interface area formed between the second load terminal and the cathode region; and
an edge termination region surrounding the active region and being terminated by a chip edge,
wherein the cathode region is laterally structured in the active region,
wherein at least one inactive subregion is included in the active region, each inactive subregion:
having a blocking area with a minimal lateral extension of at least 20% of a drift region thickness;
being configured to prevent crossing of the load current between the first load terminal and the semiconductor body through the blocking area; and
being at least partially not arranged adjacent to the edge termination region.

26. The single chip power diode of claim 25, wherein the active region has at least one active subregion, and wherein a dopant concentration of the cathode region in the at least one inactive subregion is lower as compared to the dopant concentration of the cathode region in the at least one active subregion.

27. The single chip power diode of claim 25, wherein the anode region is laterally structured in the active region, and wherein each portion of the cathode region that forms part of the at least one inactive subregion is laterally smaller than each portion of the anode region that forms part of the at least one inactive subregion.

28. The single chip power diode of claim 25, wherein the anode region is laterally structured in the active region, and wherein each portion of the cathode region that forms part of the at least one inactive subregion is laterally larger than each portion of the anode region that forms part of the at least one inactive subregion.

29. The single chip power diode of claim 25, wherein the cathode region comprises one or more highly doped subportions and one or more weakly doped subportions in each inactive subregion of the at least one inactive subregion.

30. The single chip power diode of claim 25, wherein the active region has at least one active subregion, and wherein the cathode region comprises one or more highly doped subportions and one or more weakly doped subportions in each active subregion of the at least one active subregion.

* * * * *